US008825341B2

(12) United States Patent
Fujime (10) Patent No.: US 8,825,341 B2
(45) Date of Patent: Sep. 2, 2014

(54) VEHICLE INFORMATION MANAGEMENT SYSTEM (71) Applicant: Yamaha Hatsudoki Kabushiki Kaisha, Iwata (JP)

(72) Inventor: Yoko Fujime, Shizuoka (JP)

(73) Assignee: Yamaha Hatsudoki Kabushiki Kaisha, Shizuoka (JP)

( * ) Notice: Subject to any disclaimer, the term of this patent is extended or adjusted under 35 U.S.C. 154(b) by 120 days.

(21) Appl. No.: 13/681,518

(22) Filed: Nov. 20, 2012

(65) Prior Publication Data

US 2014/0019024 A1 Jan. 16, 2014

(30) Foreign Application Priority Data

Jul. 12, 2012 (JP) ................................. 2012-156416

(51) Int. Cl.
*G06F 17/00* (2006.01)
*G07C 5/08* (2006.01)
*B60W 50/02* (2012.01)
*G01M 17/00* (2006.01)
*G01R 31/00* (2006.01)
*G07C 5/00* (2006.01)

(52) U.S. Cl.
CPC .............. *G06F 17/00* (2013.01); *G07C 5/0808* (2013.01); *B60W 50/0205* (2013.01); *G01M 17/00* (2013.01); *G01R 31/00* (2013.01); *G07C 5/0816* (2013.01); *G07C 5/085* (2013.01); *G07C 5/008* (2013.01)
USPC .............................................. 701/99; 701/67

(58) Field of Classification Search
USPC ........... 701/99, 67, 101, 115, 112, 30.1, 31.7, 701/31.8
See application file for complete search history.

(56) References Cited

U.S. PATENT DOCUMENTS

| 4,587,615 | A | * | 5/1986 | Takahashi | ..................... 701/114 |
| 4,975,848 | A | | 12/1990 | Abe et al. | |
| 6,030,261 | A | | 2/2000 | Motose | |
| 6,459,969 | B1 | | 10/2002 | Bates et al. | |
| 6,931,309 | B2 | * | 8/2005 | Phelan et al. | ..................... 701/1 |
| 2006/0030981 | A1 | | 2/2006 | Robb et al. | |
| 2006/0047380 | A1 | | 3/2006 | Welch | |
| 2006/0282565 | A1 | | 12/2006 | Kumaido et al. | |
| 2013/0041522 | A1 | * | 2/2013 | Mori et al. | ......................... 701/1 |

FOREIGN PATENT DOCUMENTS

| DE | 100 29 401 A1 | 12/2001 |
| JP | 62-291537 A | 12/1987 |
| JP | 64-083435 A | 3/1989 |
| JP | 07-295822 A | 11/1995 |

(Continued)

OTHER PUBLICATIONS

Fume, "Vehicle Information Management System," U.S. Appl. No. 13/681,512, filed Nov. 20, 2012.

*Primary Examiner* — Mary Cheung
*Assistant Examiner* — Michael Berns
(74) *Attorney, Agent, or Firm* — Keating & Bennett, LLP (57) ABSTRACT A vehicle information management system eliminates the need for a large capacity storage and allows an abnormality and a malfunction to be easily specified. An updating unit does not store diagnostic data obtained at the time of an engine stall in a storage if it is determined that the engine stalls is because of a rider's operation of the vehicle, and stores diagnostic data obtained at the time of the engine stall in the storage if it is determined that the engine stall is not attributable to a rider's operation of the vehicle, based on detection results from an operation detector and an engine state detector.

10 Claims, 5 Drawing Sheets

(56) References Cited

FOREIGN PATENT DOCUMENTS

| | | |
|---|---|---|
| JP | 08-093544 A | 4/1996 |
| JP | 08-201233 A | 8/1996 |
| JP | 08-270494 A | 10/1996 |
| JP | 10-238397 A | 9/1998 |
| JP | 2001-323841 A | 11/2001 |
| JP | 2005-041273 A | 2/2005 |
| JP | 2007-015683 A | 1/2007 |
| WO | WO0017721 A2 * 3/2000 | ............ G05B 23/02 |

* cited by examiner

|  | 1ST REGION | 2ND REGION | 3RD REGION |
|---|---|---|---|
| VEHICLE SPEED | 55 | 60 | 35 |
| BATTERY VOLTAGE | 10 | 13 | 11 |
| ENGINE TEMPARETURE | 75 | 75 | 79 |
| THROTTLE OPENING DEGREE | 25 | 10 | 15 |
| IGNITION | 45 | 50 | 60 |
| INJECTION | 18 | 20 | 18 |
| IG CYCLE | 46 | 81 | 81 |
| ENGINE REVOLUTION NUMBER | 1526 | 2212 | 2118 |
| INCLINATION ANGLE | 5 | 30 | 17 |

VEHICLE INFORMATION MANAGEMENT SYSTEM

BACKGROUND OF THE INVENTION

1. Field of the Invention

The present invention relates to vehicle information management systems, and more specifically to a vehicle information management system that manages freeze frame data.

2. Description of the Related Art

There is a known vehicle adapted to obtain freeze frame data for a vehicle and store the data in a storage in order to use it to diagnose and repair a malfunction for the occasion of an abnormality caused in the vehicle. Here, the freeze frame data refers to data that represents a state of the vehicle produced based on parameters about the state of the vehicle obtained from a plurality of sensors provided on the vehicle. In such a vehicle, a repair worker uses an external device to read out the freeze frame data from the storage and specifies the type of the malfunction at the time of repairing the vehicle.

There is a known vehicle that obtains freeze frame data and stores the freeze frame data in a storage in order to specify a cause if the engine stalls (see JP-A 08-270494).

In the vehicle disclosed by JP-A 08-270494, freeze frame data is stored in a storage when the engine stalls. If the number of data pieces included in the freeze frame data increases, it would become difficult for a repair worker to specify the content of a malfunction.

In the vehicle disclosed by JP-A 08-270494, a large number of freeze frame data pieces are stored in the storage. Therefore, the vehicle disclosed by JP-A 08-270494 needs a storage with a large capacity.

SUMMARY OF THE INVENTION

Preferred embodiments of the present invention provide a vehicle information management system including an arrangement that eliminates the need for a large capacity storage and allows an abnormality or a malfunction to be easily identified.

A vehicle information management system according to a preferred embodiment of the present invention manages diagnostic data that indicates a vehicle state and includes an engine state detector, an operation detector, a plurality of parameter detectors, a diagnostic data producing unit, a storage, and an updating unit. The engine state detector detects whether the engine stalls. The operation detector detects a rider's operation of the vehicle. The plurality of parameter detectors each detect a parameter related to the vehicle state. The diagnostic data producing unit produces the diagnostic data based on the parameters detected by the plurality of parameter detectors. The storage stores the diagnostic data. The updating unit does not store in the storage the diagnostic data obtained when the engine stalls if it is determined that the engine stalls because of a rider's operation of the vehicle, and stores in the storage the diagnostic data obtained when the engine stalls if it is determined that the engine stall is not attributable to a rider's operation of the vehicle, based on detection results from the operation detector and the engine state detector.

In the above-described vehicle information management system, when the engine stalls because of a rider's operation, diagnostic data is not stored in the storage. Therefore, the above-described vehicle information management system does not need a large capacity storage as compared to an arrangement in which diagnostic data is produced and stored in the storage whenever the engine stalls.

In the above-described vehicle information management system, when the engine stalls because of a rider's operation, diagnostic data is not stored in the storage. Therefore, in the above-described vehicle information management system, it is easy for a repair worker to search for diagnostic data critical in specifying an abnormality at the time of diagnosing and repairing. Therefore, in the vehicle information management system, it is easy for a repair worker to specify an abnormality or the content of a malfunction and thus carry out the repair.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

There is a known vehicle adapted to obtain freeze frame data for the vehicle and store the data in a storage for the purpose of specifying a malfunction and repairing it when an abnormality about the vehicle is generated.

There has been proposed a vehicle that obtains freeze frame data and stores the data in a storage in order to specify a cause when the engine stalls. In such a vehicle, if the engine stalls, freeze frame data is stored in the storage regardless of what causes the engine stall. The vehicle needs a large capacity storage in order to store a large number of freeze frame data pieces. As the number of freeze frame data pieces increases, it becomes more difficult for a repair worker to specify the cause of an abnormality and a malfunction during repair and maintenance.

The inventor of preferred embodiments of the present invention has come up with an idea of a vehicle information management system including a structure that allows the cause of an abnormality and a malfunction to be easily specified without requiring a large capacity storage. In the vehicle information management system according to a preferred embodiment of the present invention, it is determined whether an engine stall is attributable to a rider's operation. If the engine stalls because of a rider's operation, diagnostic data is not stored in the storage. Therefore, the vehicle information management system according to a preferred embodiment of the present invention does not require a large capacity storage as compared to the arrangement in which freeze frame data is produced for all cases of engine stalls and stored in the storage. The vehicle information management system according to a preferred embodiment of the present invention allows a repair worker to more easily specify and repair the cause of an abnormality and a malfunction during repair and maintenance.

Now, a motorcycle 1 including a vehicle information management system according to a preferred embodiment of the present invention will be described in conjunction with the accompanying drawings. In the drawings, the same or corresponding portions are designated by the same reference characters, and the description of the elements will not be repeated.

Figure 1:
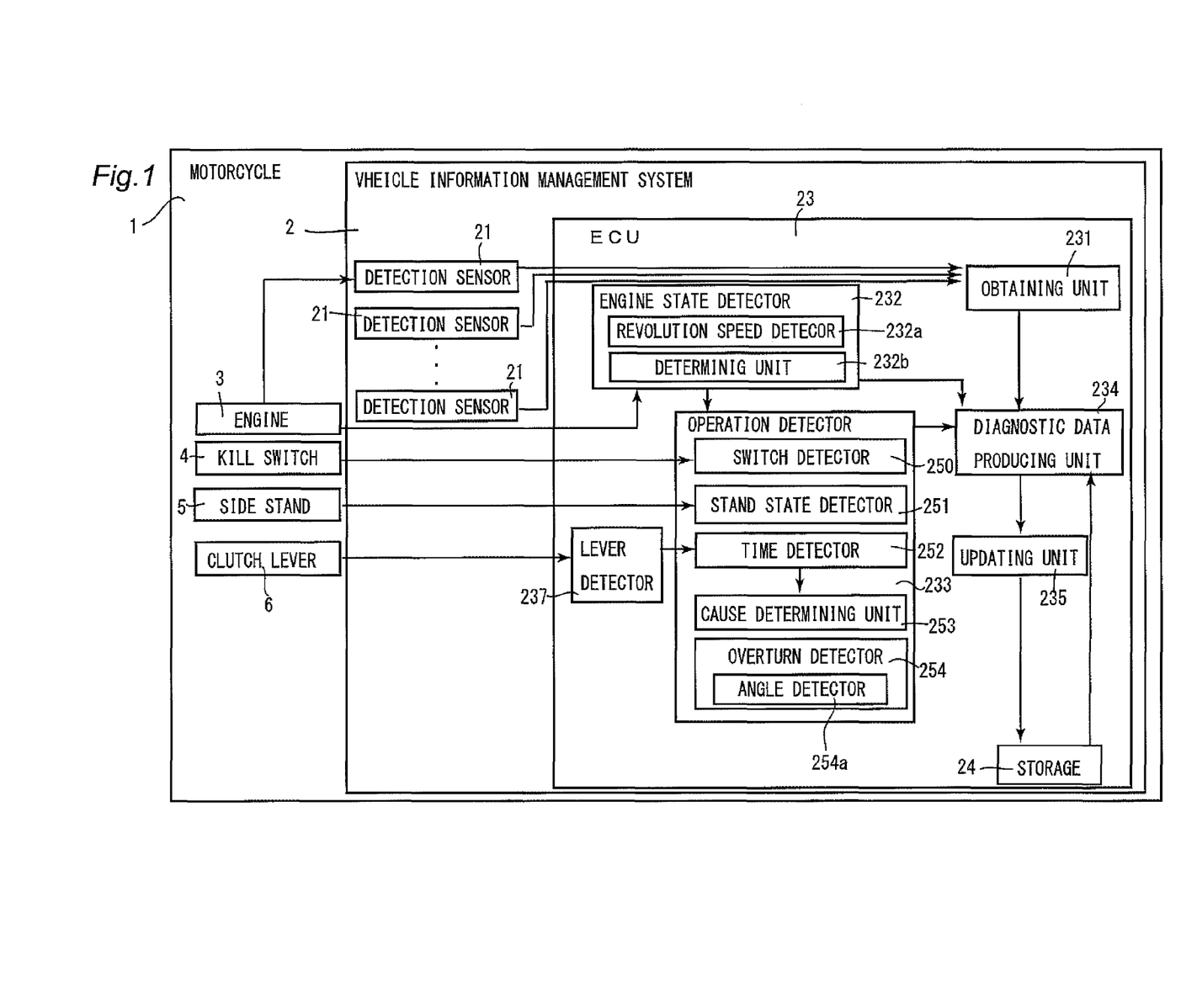
FIG. 1 is a block diagram showing a structure of a motorcycle according to a preferred embodiment of the present invention.

FIG. 1 is a block diagram of an overall structure of the motorcycle 1. The motorcycle 1 includes an engine 3, a kill switch 4, a side stand 5, a clutch lever 6, and a vehicle information management system 2.

The kill switch 4 outputs a signal to an ECU 23 included in the vehicle management system 2 in response to a rider's operation. Upon receiving the signal from the kill switch 4, the ECU 23 stops the engine 3. When the motorcycle 1 is parked, the side stand 5 supports the vehicle body so that the motorcycle 1 does not topple. The side stand 5 can be switched between a support state to support the vehicle body of the motorcycle 1 and a stand-by state in which the side stand 5 does not interfere with traveling of the motorcycle 1. The clutch lever 6 is operated by a rider to switch the clutch. When the clutch lever 6 is operated, the clutch is switched between a state in which it can transfer motive power and a state in which it cuts off the motive power.

The vehicle information management system 2 includes a plurality of detection sensors 21 (each corresponding to a parameter detector) and the ECU (electronic control unit) 23. The plurality of detection sensors 21 are attached to the engine 3, the power supply, and the like of the motorcycle 1. The detection sensors 21 each detect a parameter related to a vehicle state. For example, the plurality of detection sensors 21 include various sensors such as a vehicle speed sensor used to detect a vehicle speed and a throttle sensor. The plurality of detection sensors 21 are connected to the ECU 23.

The ECU 23 controls the engine 3 and the like provided on the motorcycle 1. The ECU 23 includes an obtaining unit 231, a lever detector 237, an engine state detector 232, an operation detector 233, a diagnostic data producing unit 234, an updating unit 235, and a storage 24.

The obtaining unit 231 obtains parameters related to the vehicle state from the detection sensors 21. The engine state detector 232 detects a state of the engine 3. The engine state detector 232 determines whether the engine stalls. The engine state detector 232 is connected to the engine 3. The engine state detector 232 includes a revolution speed detector 232a and a determining unit 232b. The revolution speed detector 232a detects a revolution speed of the engine 3. The determining unit 232b determines whether a detection result of the revolution speed detector 232a is smaller than a predetermined first threshold value. The engine state detector 232 determines that the engine stalls if the revolution speed of the engine 3 is smaller than the first threshold value.

The lever detector 237 detects an operation of the clutch lever 6 by a rider. The lever detector 237 is connected to the clutch lever 6.

The operation detector 233 detects an operation of the motorcycle 1 by the rider. The operation detector 233 detects the rider's operation of the motorcycle 1 that could cause the engine to stall. The operation detector 233 is connected with a switch detector 250, a stand state detector 251, a time detector 252, a cause determining unit 253, and an overturn detector 254. The operation detector 233 is connected to the diagnostic data producing unit 234.

The switch detector 250 is connected to the kill switch 4. The switch detector 250 determines whether the kill switch 4 is pressed. The stand state detector 251 detects a state of the side stand 5. The stand state detector 251 detects the support state and stand-by state of the side stand 5. When the support state of the side stand 5 is detected by the stand state detector 251, the ECU 23 stops the engine 3.

When the clutch lever 6 is operated and the engine 3 stops, the time detector 252 detects a time between the detection of the operation of the clutch lever 6 by the lever detector 237 and the stopping of the engine 3. The cause determining unit 253 determines whether the time detected by the time detector 252 is not more than a predetermined second threshold value.

The overturn detector 254 detects an overturn of the motorcycle 1. The overturn detector 254 includes an angle detector 254a. The angle detector 254a detects an inclination angle (lean angle) of the motorcycle 1 with respect to the vertical direction. The overturn detector 254 determines that the motorcycle 1 is overturned when the inclination angle of the motorcycle 1 detected by the angle detector 254a is not more than a prescribed threshold value.

The diagnostic data producing unit 234 produces diagnostic data based on parameters detected by the detection sensors 21. The diagnostic data producing unit 234 produces the diagnostic data by arranging the parameters in a predetermined order. The diagnostic data producing unit 234 does not produce diagnostic data when it is determined based on detection results from the operation detector 233 and the engine state detector 232 that the engine stalls because of an operation of the vehicle by a rider. The diagnostic data producing unit 234 produces diagnostic data when it is determined based on detection results from the operation detector 233 and the engine state detector 232 that the engine stall is not attributable to a rider's operation of the vehicle.

The diagnostic data producing unit 234 determines whether the engine stalls because of an operation by a rider of the vehicle by referring to cause data pre-stored in the storage 24. The cause data includes information used to determine whether the engine stalls because of a rider's operation. The updating unit 235 stores the diagnostic data produced by the diagnostic data producing unit 234 in the storage 24.

The storage 24 stores diagnostic data. The storage 24 includes a plurality of storage regions capable of storing diagnostic data. The storage 24 also pre-stores cause data.

Figure 2:
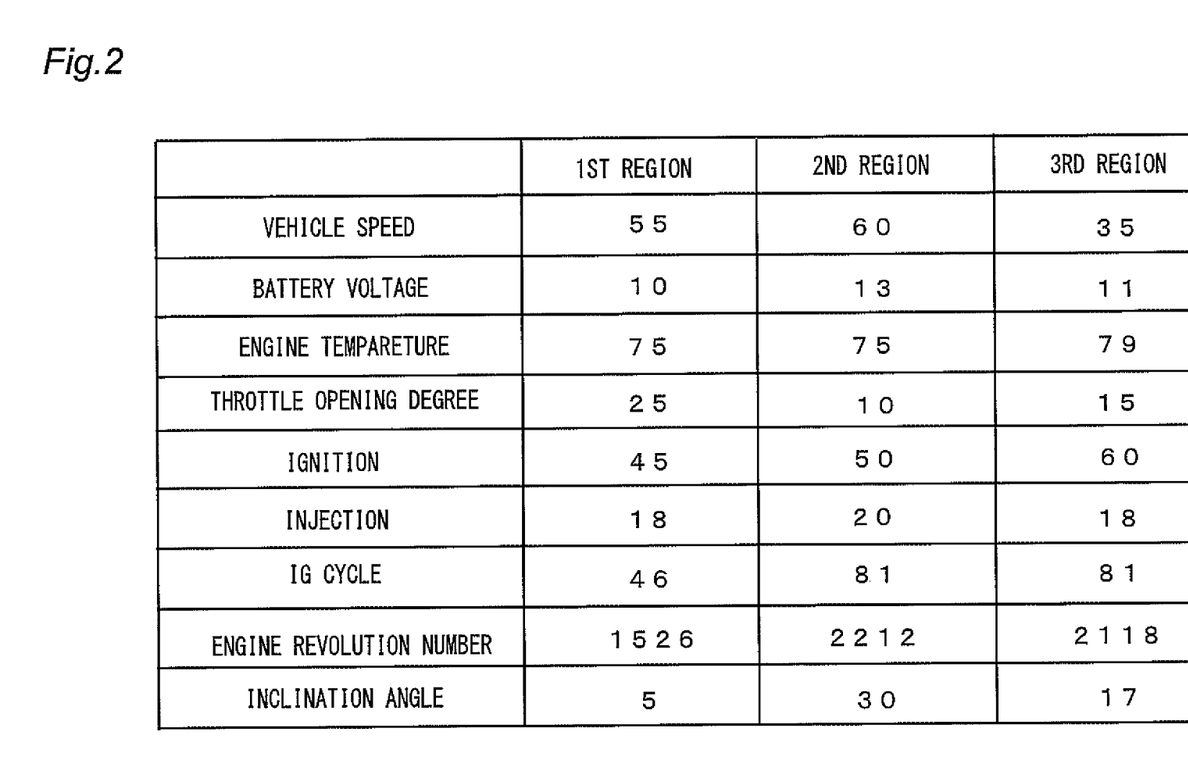
FIG. 2 shows a specific example of diagnostic data stored in a storage region.

FIG. 2 shows an example of diagnostic data stored in each of the storage regions. The three storage regions included in the storage 24 each include one piece of diagnostic data. The storage regions are each capable of storing one piece of diagnostic data. The items or numerical values of the diagnostic data shown in FIG. 2 are simply examples and they are not limited to these examples. For example, the number of items in the diagnostic data may be different from the example shown in FIG. 2. The diagnostic data includes a plurality of parameters related to a vehicle state such as a vehicle speed and battery voltage.

Figure 3:
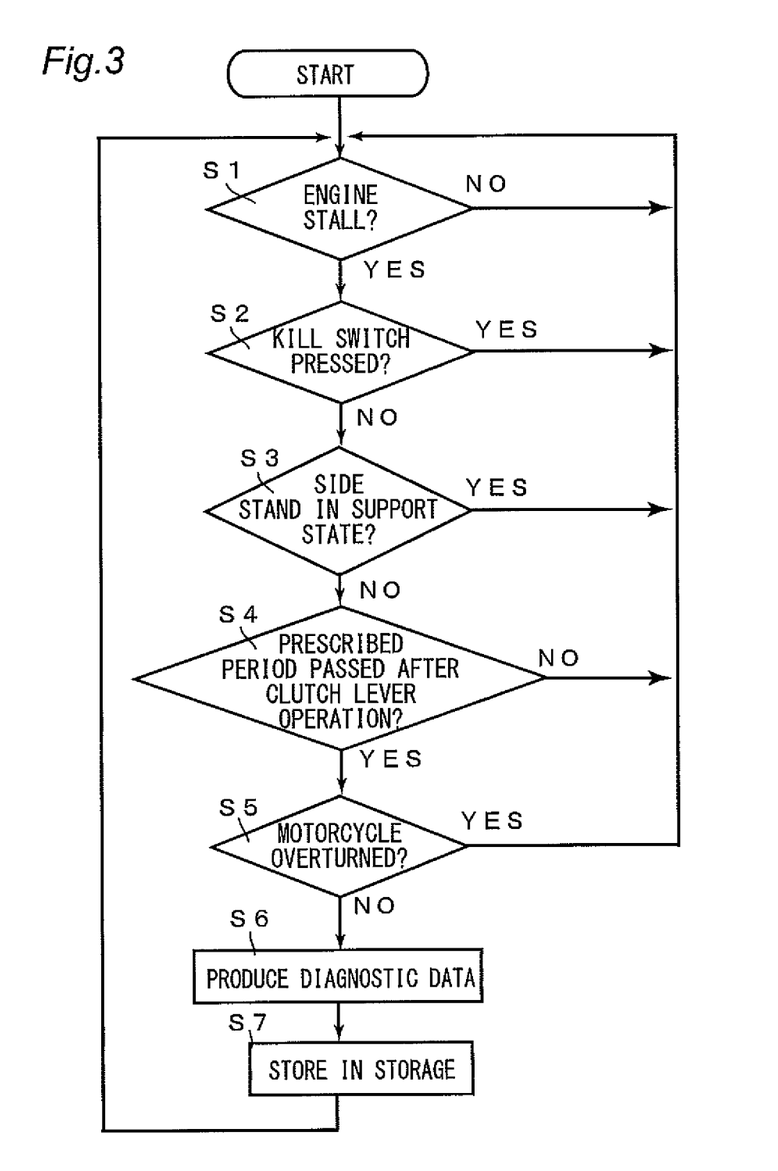
FIG. 3 is a flowchart for illustrating an operation of a vehicle information management system.

FIG. 3 is a flowchart for illustrating an operation of the vehicle information management system 2. The operation of the vehicle information management system 2 will be described with reference to the flowchart. In the vehicle information management system, the detector sensors 21 always obtain parameters, but the present invention is not limited to this arrangement and parameters may be obtained in prescribed timing.

The engine state detector 232 determines whether the engine stalls based on a detection result from the revolution speed detector 232a (step S1). If the engine does not stall (NO in step S1), the process returns to step S1. On the other hand, if the engine stalls (YES in step S1), it is determined whether the engine stall is attributable to a rider's operation based on cause data. The operation of determining whether the engine stall is attributable to a rider's operation will be described below.

It is determined whether the kill switch 4 is pressed in a prescribed time period before the engine stalls (step S2). If the kill switch 4 is pressed, it is determined that the engine stall is attributable to a rider's operation and the process returns to step S1 (YES in step S2). On the other hand, if the kill switch 4 is not pressed (NO in step S2), it is determined whether the side stand 5 changes its state from a stand-by state to a support state during a prescribed time period before the engine stalls (step S3). If the side stand 5 changes from a stand-by state to a support state (YES in step S3), it is determined that the engine stall is attributable to a rider's operation and the process returns to step S1. On the other hand, if the side stand 5 does not change its state from a stand-by state to a support state (NO in step S3), it is determined whether a time after an operation of the clutch lever 6 until the engine stall is not more than a second threshold value (step S4).

If the time after the operation of the clutch lever 6 until the engine stall is not more than the second threshold value (NO in step S4), it is determined that the engine stall is attributable to a rider's operation and the process returns to step S1. On the other hand, if the time after the operation of the clutch lever 6 until the engine stall is more than the second threshold value (YES in step S4), it is determined whether the motorcycle 1 is overturned (step S5). If it is determined that the motorcycle 1 is overturned (YES in step S5), it is determined that the overturn is attributable to a rider's operation and the process returns to step S1. On the other hand, if the motorcycle 1 is not overturned (NO in step S5), it is determined that the engine stall is not attributable to a rider's operation and an operation of storing diagnostic data in the storage 24 is carried out.

If it is determined that the engine stall is not attributable to a rider's operation (NO in step S2, NO in step S3, YES in step S4, and NO in step S5), the diagnostic data producing unit 234 produces diagnostic data based on parameters obtained by the detection sensors 21 (step S6). When the diagnostic data producing unit 234 produces the diagnostic data, the updating unit 235 stores the diagnostic data in the storage 24 (step S7).

Figure 4:
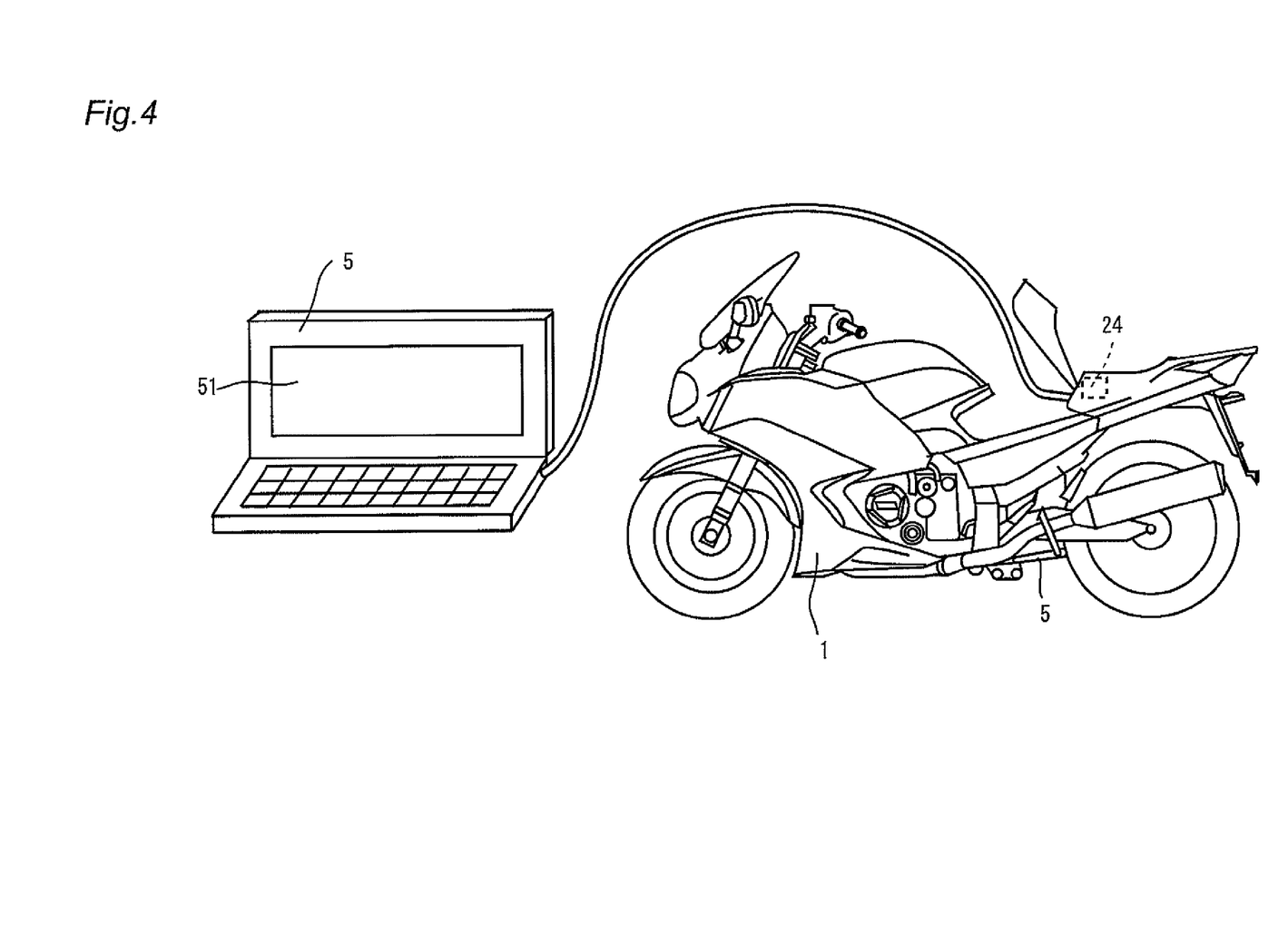
FIG. 4 is an overall view of how a motorcycle is connected to an external device.

FIG. 4 is a view showing how the motorcycle 1 is connected to the external device 5. In order to specify and repair a malfunction or an abnormality, a repair worker connects the motorcycle 1 and the external device 5. For example, the abnormality refers to a case in which parameters detected by the detection sensors 21 are outside a predetermined normal range. The external device 5 reads out the diagnostic data stored in the storage 24 of the motorcycle 1. The external device 5 displays the diagnostic data read out from the motorcycle 1 on the display 51. The repair worker checks the location of the abnormality or the content of the malfunction from the diagnostic data displayed on the display 51 and carries out the repair. The external device 5 may be a generally used PC instead of a dedicated reader, for example.

Figure 5:
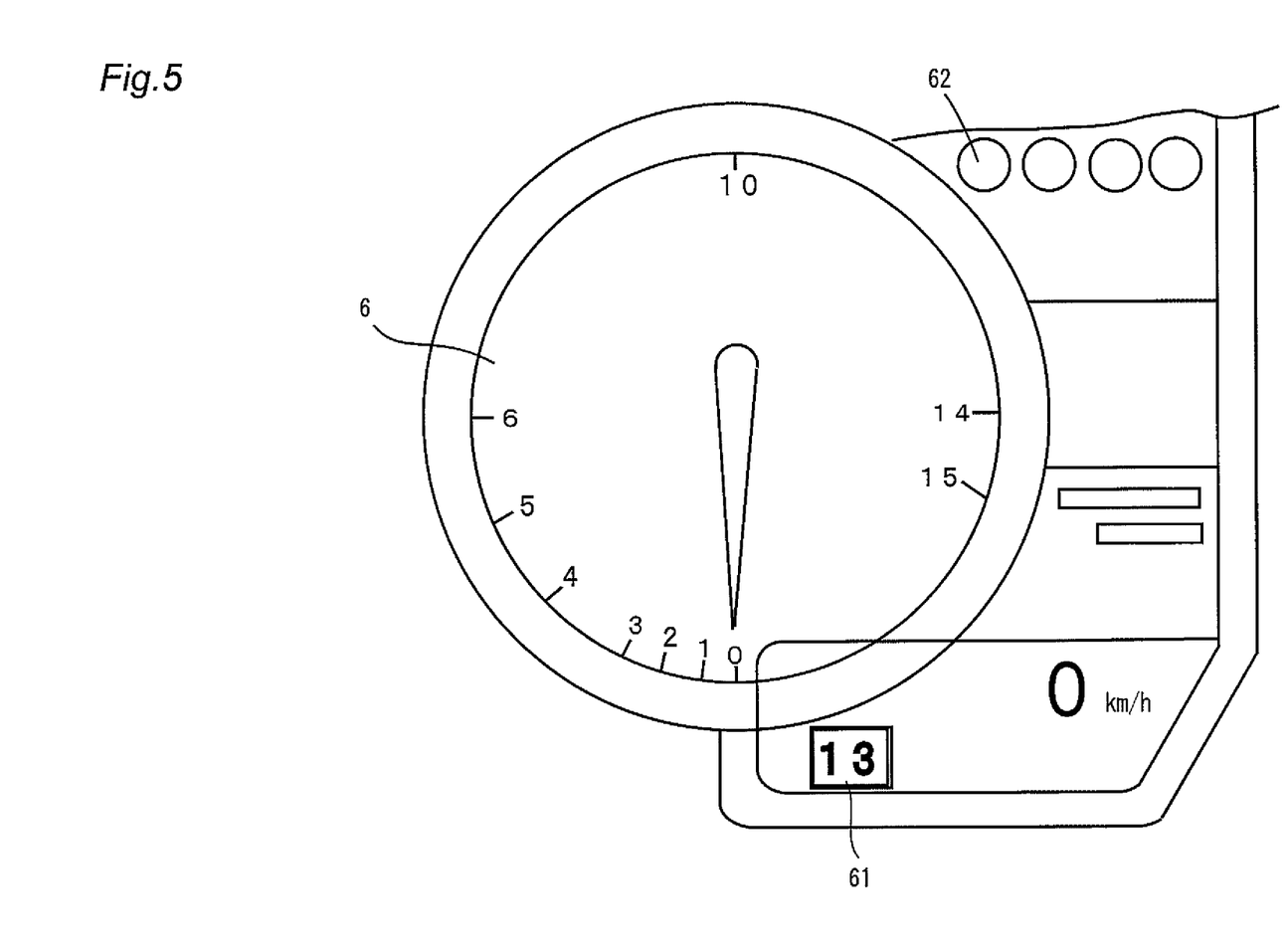
FIG. 5 is a partially enlarged front view of a periphery of a meter at a motorcycle.

FIG. 5 is a partially enlarged front view showing a meter 6 provided on the motorcycle 1. The meter 6 displays parameters used to show a state of the motorcycle 1 such as a vehicle speed. The meter 6 is provided with an abnormality warning unit 61 and an indicator 62. The abnormality warning unit 61 lights up if an abnormality about the vehicle is detected. A rider can become aware of the abnormality from the warning by the warning unit 61. The indicator 62 lets a rider become aware of a vehicle state such as the vehicle being low on fuel. A plurality of such indicators 62 are preferably provided side-by-side, for example.

In the above-described motorcycle 1, if the engine stalls, it is determined whether the engine stall is attributable to a rider's operation. If the engine stalls because of a rider's operation, diagnostic data is not stored in the storage 24. Therefore, the amount of diagnostic data stored in the storage 24 is smaller than the case of producing diagnostic data and storing the diagnostic data in the storage 24 every time the engine stalls. Therefore, the motorcycle 1 may have a storage 24 with a smaller storage capacity than the case of producing diagnostic data and storing the diagnostic data in the storage every time the engine stalls. In the motorcycle 1 described above, diagnostic data unrelated to abnormalities of the vehicle is less likely to be included as compared to the case of obtaining diagnostic data for all the cases of engine stalls and storing the diagnostic data in the storage 24. Therefore, in the above-described motorcycle 1, it is easier to check the content of an abnormality or a malfunction and repair it when the vehicle is subjected to maintenance or repair.

When the engine stalls because of a rider's operation, neither an abnormality nor a malfunction exists in the vehicle. Therefore, if diagnostic data is produced in response to an engine stall attributable to a rider's operation and stored in the storage 24, the data is never used for performing the repair. Such diagnostic data unrelated to any abnormality or malfunction stored in the storage 24 would impede a searching operation for critical diagnostic data to be used for the repair. Since in the above-described motorcycle 1, diagnostic data is not stored in the storage 24 if an engine stall is attributable to a rider's operation, the search for critical diagnostic data for the repair may be conducted more easily.

In the above-described motorcycle 1, whether the engine stalls is determined based on an engine revolution speed detected by the revolution speed detector 232a. Therefore, the motorcycle 1 can detect engine stalls with high accuracy.

In the above-described motorcycle 1, it is determined whether the engine stalls in response to an operation of the kill switch 4. In the motorcycle 1, if the engine stalls in response to an operation of the kill switch 4, diagnostic data is not stored in the storage 24.

A rider sometimes stops the engine 3 by switching the side stand 5 from a stand-by state to a support state. If it is set that diagnostic data is stored in the storage 24 in such a case, diagnostic data is stored every time the side stand 5 is switched from a stand-by state to a support state. This makes it difficult for a repair worker to know which data is critical in carrying out maintenance or repair. In the above-described motorcycle 1, if the engine stalls in response to an operation of switching the side stand 5 from a stand-by state to a support state, diagnostic data is not stored in the structure 24. Therefore, in the motorcycle 1, it is easier to find diagnostic data critical in carrying out maintenance or repair.

In the above-described motorcycle 1, it is determined whether the engine stalls within a prescribed time period after an operation of the clutch lever 6. If the engine stalls within the prescribed time period after an operation of the clutch lever 6, it is highly likely that a rider has made a mistake in the clutch connecting operation. If the engine stalls because of such a rider's mistake in the clutch connecting operation, it is highly likely that there is no abnormality about the vehicle. In the motorcycle 1, if the engine stalls within a prescribed time period after an operation of the clutch lever 6, diagnostic data is not stored in the storage 24. Therefore, diagnostic data critical in carrying out repair or the like is more easily stored in the storage 24.

The above description of preferred embodiments relates to the motorcycle 1, but the present invention is not limited to the preferred embodiments described above and may be applied to a three- or four-wheeled saddle riding type vehicle, for example.

In the motorcycle 1 according to the above-described preferred embodiments, diagnostic data is not produced for an engine stall attributable to an overturn of the motorcycle 1, but the present invention is not limited to this. When the motorcycle 1 is overturned, the vehicle may be determined to have an abnormality. Therefore, when the motorcycle 1 is overturned, diagnostic data may be produced and stored in the storage 24. In this way, a repair worker can more easily specify such an abnormality caused by an overturn of the motorcycle 1.

In the above-described motorcycle 1, the operations by a rider that could cause the engine to stall are examples only and such operations are not limited to those of the preferred embodiments. Operations may be included other than those included as the operations by a rider that could cause the engine to stall in the description of the preferred embodiments. For example, preferred embodiments of the present invention do not have to include all the operations by a rider that could cause the engine to stall.

In the motorcycle 1 according to the preferred embodiments above, when the engine stalls because of a rider's operation, the diagnostic data producing unit 234 does not produce diagnostic data and therefore diagnostic data is not stored in the storage 24. The present invention is not limited to this, and diagnostic data may be produced every time the engine stalls and the updating unit 235 may determine whether or not to store the diagnostic data in the storage 24.

In the motorcycle 1 according to the preferred embodiments above, preferably it is determined whether an engine stall is attributable to a rider's operation of the vehicle based on detection results from the engine state detector 232 and the operation detector 233 by referring to cause data, and it is then determined whether or not to produce diagnostic data. However, the present invention is not limited to this. For example, the operation detector 233 may determine whether there is a rider's operation of the vehicle that could cause the engine to stall and whether or not to produce diagnostic data may be determined based on detection results from the engine state detector 232 and the operation detector 233.

In the motorcycle 1 according to the preferred embodiments above, the abnormality warning unit 61 is preferably provided on the meter 6, although the present invention is not limited to this arrangement. The location of the abnormality warning unit 61 may be any place as long as a rider can recognize it and may be provided, for example, on the handle. The abnormality warning unit 61 does not have to indicate the content of the warning, but instead a lamp may simply be turned on to make such warning. For example, the indicator 62 may light up to make warning about an abnormality.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vehicle information management system that manages diagnostic data that indicates a vehicle state, the vehicle information management system comprising:
   an engine state detector arranged to detect whether an engine stalls;
   an operation detector arranged to detect a rider's operation of the vehicle;
   a plurality of parameter detectors arranged to detect parameters related to the vehicle state;
   a diagnostic data producing unit programmed to produce the diagnostic data based on the parameters detected by the plurality of parameter detectors;
   a storage arranged to store the diagnostic data; and
   an updating unit programmed to, based on detection results from the operation detector and the engine state detector, not store in the storage the diagnostic data obtained when the engine stalls if it is determined that the engine stalls because of the rider's operation of the vehicle, and to store in the storage the diagnostic data obtained when the engine stalls if it is determined that the engine stall is not attributable to the rider's operation of the vehicle.

2. The vehicle information management system according to claim 1, wherein the engine state detector includes a revolution speed detector arranged to detect a revolution speed of the engine, and the engine state detector is programmed to determine that the engine stalls if the revolution speed of the engine is not more than a first threshold value.

3. The vehicle information management system according to claim 1, wherein the operation detector includes a switch detector arranged to determine whether a kill switch of the vehicle is operated, and the operation detector is programmed to determine that if the engine stalls in response to an operation of the kill switch, then the engine stalls because of the rider's operation and the updating unit does not store the diagnostic data in the storage.

4. The vehicle information management system according to claim 1, wherein the operation detector includes a stand state detector that determines whether a stand of the vehicle supports a vehicle body, and the operation detector is programmed to determine that if the engine stalls because the stand changes its state to a state to support the vehicle, then the engine stalls because of the rider's operation, and the updating unit does not store the diagnostic data in the storage.

5. The vehicle information management system according to claim 1, further comprising a lever detector arranged to detect an operation of a clutch lever provided on the vehicle; wherein
   the operation detector includes:
      a time detector arranged to detect a time from an operation of the clutch lever to a stall of the engine when the engine stalls; and
      a cause determining unit programmed to determine whether a result of detection from the time detector is not more than a second threshold value; wherein
   if a result of detection from the time detector is not more than the second threshold value, the operation detector determines that the engine stalls because of the rider's operation and the updating unit does not store the diagnostic data in the storage.

6. The vehicle information management system according to claim 1, wherein the operation detector includes an overturn detector arranged to detect whether the vehicle is overturned, and the operation detector is programmed to determine that if the engine stalls because of an overturn of the vehicle, then the engine stalls because of the rider's operation and the updating unit does not store the diagnostic data in the storage.

7. The vehicle information management system according to claim 6, wherein the overturn detector includes an angle detector arranged to detect an inclination angle of the vehicle.

8. The vehicle information management system according to claim 1, further comprising:
   a reader programmed to read the diagnostic data stored in the storage; and
   a display that displays the diagnostic data read from the vehicle information management system.

9. A saddle riding type vehicle comprising:
   a vehicle information management system that manages diagnostic data that indicates a vehicle state, the vehicle information management system comprising;

an engine state detector arranged to detect whether an engine stalls;

an operation detector arranged to detect a rider's operation of the vehicle;

a plurality of parameter detectors arranged to detect parameters related to the vehicle state;

a diagnostic data producing unit programmed to produce the diagnostic data based on the parameters detected by the plurality of parameter detectors;

a storage arranged to store the diagnostic data; and an updating unit programmed to, based on detection results from the operation detector and the engine state detector, not store in the storage the diagnostic data obtained when the engine stalls if it is determined that the engine stalls because of the rider's operation of the vehicle, and to store in the storage the diagnostic data obtained when the engine stalls if it is determined that the engine stall is not attributable to the rider's operation of the vehicle.

10. The saddle riding type vehicle according to claim 9, further comprising a warning unit arranged to warn the rider about an abnormality in the vehicle, and the warning unit lights up when an abnormality is detected based on the diagnostic data.

\* \* \* \* \*